United States Patent
Lee

(10) Patent No.: US 11,253,970 B2
(45) Date of Patent: Feb. 22, 2022

(54) SLURRY COOLING DEVICE AND SLURRY SUPPLY SYSTEM HAVING THE SAME

(71) Applicant: SK SILTRON CO., LTD., Gumi-si (KR)

(72) Inventor: Sang Ho Lee, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 961 days.

(21) Appl. No.: 15/973,936

(22) Filed: May 8, 2018

(65) Prior Publication Data

US 2019/0210186 A1    Jul. 11, 2019

(30) Foreign Application Priority Data

Jan. 8, 2018   (KR) .................. 10-2018-0002074

(51) Int. Cl.
| | |
|---|---|
| *B24B 55/02* | (2006.01) |
| *B24B 57/02* | (2006.01) |
| *B24B 37/04* | (2012.01) |
| *H01L 21/02* | (2006.01) |

(52) U.S. Cl.
CPC .............. *B24B 57/02* (2013.01); *B24B 37/04* (2013.01); *H01L 21/02024* (2013.01)

(58) Field of Classification Search
CPC .... B24B 57/02; B24B 37/04; H01L 21/02024
USPC .................................. 451/449, 41, 446, 60
See application file for complete search history.

(56) References Cited

U.S. PATENT DOCUMENTS

| | | | | |
|---|---|---|---|---|
| 9,050,851 | B2 * | 6/2015 | Boehm | .................. B44C 1/227 |
| 9,550,270 | B2 * | 1/2017 | Hung | .................. H01L 21/3212 |
| 2002/0045412 | A1 * | 4/2002 | Tanaka | ..................... B24B 57/02 |
| | | | | 451/60 |
| 2009/0298393 | A1 * | 12/2009 | Kozasa | ................... B24B 57/02 |
| | | | | 451/41 |
| 2015/0000881 | A1 * | 1/2015 | Tamura | ................. F28F 13/185 |
| | | | | 165/157 |
| 2015/0117135 | A1 * | 4/2015 | Chen | ....................... B24B 37/04 |
| | | | | 366/142 |

FOREIGN PATENT DOCUMENTS

| | | |
|---|---|---|
| CN | 101209542 | 7/2008 |
| CN | 204262993 | 4/2015 |
| CN | 105583734 | 5/2016 |

(Continued)

OTHER PUBLICATIONS

Chinese Office Action dated Jun. 30, 2020 issued in Application No. 201810679036.5 (English translation attached).

(Continued)

*Primary Examiner* — Joseph J Hail
*Assistant Examiner* — Shantese L McDonald
(74) *Attorney, Agent, or Firm* — Ked & Associates, LLP

(57) ABSTRACT

According to the present invention, there is provided a slurry supply system including: a slurry mixing unit configured to mix slurry; a slurry supply unit in which the slurry mixed in the slurry mixing unit is stored and configured to supply the slurry to a polishing apparatus; a pipe configured to connect the slurry mixing unit and the slurry supply unit; and a slurry cooling unit installed in at least one of pipes configured to connect the slurry supply unit and the polishing apparatus to cool down the mixed slurry.

10 Claims, 6 Drawing Sheets

(56) References Cited

FOREIGN PATENT DOCUMENTS

| | | |
|---|---|---|
| CN | 105605963 | 5/2016 |
| CN | 205957770 | 2/2017 |
| JP | S 55-149640 | 11/1980 |
| JP | 2002-172562 | 6/2002 |
| JP | 2003-197576 | 7/2003 |
| JP | 2003-197577 | 7/2003 |
| JP | 2005-066731 | 3/2005 |
| JP | 2005-262402 | 9/2005 |
| JP | 2012-207813 | 10/2012 |
| JP | 2014-210296 | 11/2014 |
| JP | 2015-010749 | 1/2015 |
| JP | 2017-141673 | 8/2017 |
| JP | 2017-218930 | 12/2017 |
| KR | 10-2016-0148955 | 12/2016 |

OTHER PUBLICATIONS

Korean Office Action dated May 29, 2019 issued in Application No. 10-2018-0002074.
Chinese Office Action dated Feb. 19, 2021 issued in Application No. 201810679036.5 (English translation attached).
Japanese Office Action dated Apr. 9, 2019 issued in Application No. 2018-089174.

\* cited by examiner

SLURRY COOLING DEVICE AND SLURRY SUPPLY SYSTEM HAVING THE SAME

CROSS-REFERENCE TO RELATED APPLICATIONS

This application claims under 35 U.S.C. § 119 to Korean Patent Application No. 10-2018-0002074, filed on Jan. 8, 2018, which is hereby incorporated by reference.

TECHNICAL FIELD

The present invention relates to a semiconductor processing apparatus, and more particularly, to an apparatus for supplying slurry to a polishing apparatus.

BACKGROUND

A semiconductor wafer is produced as a wafer through steps of a slicing process for thinly slicing a single crystal silicon ingot into a wafer shape, a lapping process for improving flatness while polishing to a desired thickness, an etching process for removing a damaged layer inside a wafer, a polishing process for improving mirroring and flatness on a wafer surface, a cleaning process for removing contaminants on a wafer surface, and the like.

Meanwhile, a polishing apparatus configured to perform a lapping process and a polishing process is continuously supplied with mixed slurry in which polishing particles, dispersant, diluent, deionized water, and the like are mixed. To this end, the polishing apparatus is connected to a slurry supply system having a slurry tank in which slurry is mixed and the mixed slurry is stored.

FIG. 1 is a configuration diagram of a slurry supply system of an embodiment, and FIG. 2 is a cross-sectional view of an inside of a slurry tank of FIG. 1.

As shown in FIG. 1, a slurry supply system 10 may include a slurry mixing unit 100 configured to mix slurry and a slurry supply unit 200 in which the mixed slurry is stored and supplied to a polishing apparatus (FP) 300. Pumps 130, 150, and 220 are installed in the slurry supply system 10 to forcibly transfer the slurry for each of slurry tanks 120, 140, and 210.

As described above, since the slurry supply system 10 operates the pumps 130, 150 and 220, a temperature of the mixed slurry stored in the slurry tanks 120, 140, and 210 increases and physical properties thereof change. Accordingly, in order to decrease the temperature of the mixed slurry to an appropriate temperature, chiller lines 310, 320 and 330 through which cooling water flows are installed in the slurry tanks 120, 140, and 210 along inner circumferential surfaces of the slurry tanks 120, 140, 210. As shown in FIG. 2, the positions of the chiller lines 310, 320, and 330 are fixed inside the slurry tanks 120, 140, and 210 by a fixing rack 350.

However, the chiller lines 310, 320, and 330 may be broken by friction occurring between the chiller lines 310, 320, and 330 and the fixing rack 350, due to the flow of the slurry flowing in the slurry tanks 120, 140, and 210 and the cooling water flowing along the chiller lines 310, 320, 330.

Accordingly, the slurry may be contaminated by a leakage of the cooling water occurring in the slurry tanks 120, 140, and 210 through the chiller lines 310, 320, and 330, and the quality of a wafer polished in the polishing apparatus (FP) 300 may be degraded due to the contaminated slurry.

In addition, since the chiller lines 310, 320, and 330 are installed in the slurry tanks 120, 140, and 210, even though a leakage occurs, it cannot be checked with naked eyes, so there is difficulty in immediate response.

SUMMARY

The present invention is directed to providing a slurry cooling device capable of preventing slurry from being contaminated by leakage of cooling water while efficiently cooling down the slurry and checking presence of leakage of cooling water with naked eyes and a slurry supply system having the same.

According to the present invention, there is provided a slurry supply system including: a slurry mixing unit configured to mix slurry; a slurry supply unit in which the slurry mixed in the slurry mixing unit is stored and configured to supply the slurry to a polishing apparatus; a pipe configured to connect the slurry mixing unit and the slurry supply unit; and a slurry cooling unit installed in at least one of pipes configured to connect the slurry supply unit and the polishing apparatus to cool down the mixed slurry.

The slurry mixing unit may include: a distribution tank in which slurry supplied from a central chemical supply system (CCSS) is stored; a first mixing tank configured to mix the slurry and deionized water after the slurry stored in the distribution tank is distributed; a second mixing tank in which the slurry mixed in the first mixing tank is stored; and a transfer pipe configured to transfer the mixed slurry stored in the second mixing tank to the slurry supply unit.

The slurry supply unit may include: a supply pipe configured to supply slurry to the polishing apparatus; an inlet pipe through which the mixed slurry is introduced from the transfer pipe; and a storage tank connected to the inlet pipe to store the mixed slurry and connected to the supply pipe.

The slurry cooling unit may be installed at both between the transfer pipe and the inlet pipe and between the supply pipe and a connection pipe configured to connect the polishing apparatus.

The slurry cooling unit may include: a first body unit connected to a pipe through which the mixed slurry is introduced; a second body unit connected to a pipe through which the mixed slurry flows out; a plurality of tube pipes disposed between the first body unit and the second body unit and configured to branch the mixed slurry; and a cooling water circulation pipe coupled to the first and second body units to surround outer sides of the plurality of tube pipes and configured to circulate cooling water therein.

The first body unit and the second body unit may each include a coupling pipe located so as to protrude outward so that a pipe is inserted and fixed thereto.

Gaps between the plurality of tube pipes may be gradually increased from an outer side to an inner side of the coupling pipe so that the plurality of tube pipes may be disposed spaced apart from the cooling water circulation pipe at a predetermined interval.

The slurry supply system may further include a fixing plate inserted into the cooling water circulation pipe and configured to fix a spacing position of the plurality of tube pipes.

The fixing plate may be disposed in plural spaced apart from an inner side of the cooling water circulation pipe.

The fixing plate may include: a fixing plate body having a plurality of insertion holes into which the plurality of tube pipes are inserted formed therein; and a plurality of coupling protrusions coupled to an outer side of the fixing plate body and in close contact with the inner side of the cooling water circulation pipe.

The plurality of coupling protrusions may be disposed spaced apart from each other at a predetermined interval to form a flow path configured to circulate the cooling water inside the cooling water circulation pipe.

The slurry cooling unit may further include: a cooling water inlet pipe coupled to the cooling water circulation pipe and configured to introduce cooling water into the cooling water circulation pipe; and a cooling water outlet pipe coupled to the cooling water circulation pipe and configured to discharge the cooling water circulated in the cooling water circulation pipe.

The cooling water inlet pipe may be disposed adjacent to the first body unit, and the cooling water outlet pipe may be disposed adjacent to the second body unit.

The cooling water inlet pipe may be located in a lower portion of the cooling water circulation pipe, and the cooling water outlet pipe may be located in an upper portion of the cooling water circulation pipe.

The slurry cooling unit may be made of a transparent material.

Meanwhile, according to the present invention, there is provided a slurry supply system including: a slurry mixing unit configured to mix slurry; a slurry supply unit in which the slurry mixed in the slurry mixing unit is stored; a transfer pipe configured to transfer the slurry mixed in the slurry mixing unit to the slurry supply unit; a supply pipe configured to supply the mixed slurry stored in the slurry supply unit to a polishing apparatus; and a slurry cooling unit installed in at least one of the transfer pipe and the supply pipe to cool down the mixed slurry.

The slurry cooling unit may include: a first body unit connected to a pipe through which the mixed slurry is introduced; a second body unit connected to a pipe through which the mixed slurry flows out; a plurality of tube pipes disposed between the first body unit and the second body unit and configured to branch the mixed slurry; and a cooling water circulation pipe coupled to the first and second body units to surround outer sides of the plurality of tube pipes and configured to circulate cooling water therein.

The slurry cooling unit may further include: a cooling water inlet pipe coupled to the cooling water circulation pipe and configured to introduce cooling water into the cooling water circulation pipe; and a cooling water outlet pipe coupled to the cooling water circulation pipe and configured to discharge the cooling water circulated in the cooling water circulation pipe.

Meanwhile, according to the present invention, there is provided a slurry cooling apparatus including: a first body unit connected to a pipe through which mixed slurry is introduced; a second body unit connected to a pipe through which the mixed slurry flows out; a plurality of tube pipes disposed between the first body unit and the second body unit and configured to branch the mixed slurry; a cooling water circulation pipe coupled to the first and second body units to surround outer sides of the plurality of tube pipes and configured to circulate cooling water therein; a cooling water inlet pipe configured to introduce cooling water into the cooling water circulation pipe; and a cooling water outlet pipe configured to discharge the cooling water circulated in the cooling water circulation pipe.

The first body unit and the second body unit may each include a coupling pipe located so as to protrude outward so that the pipe may be inserted and fixed.

DETAILED DESCRIPTION OF THE EMBODIMENTS

Figure 1:
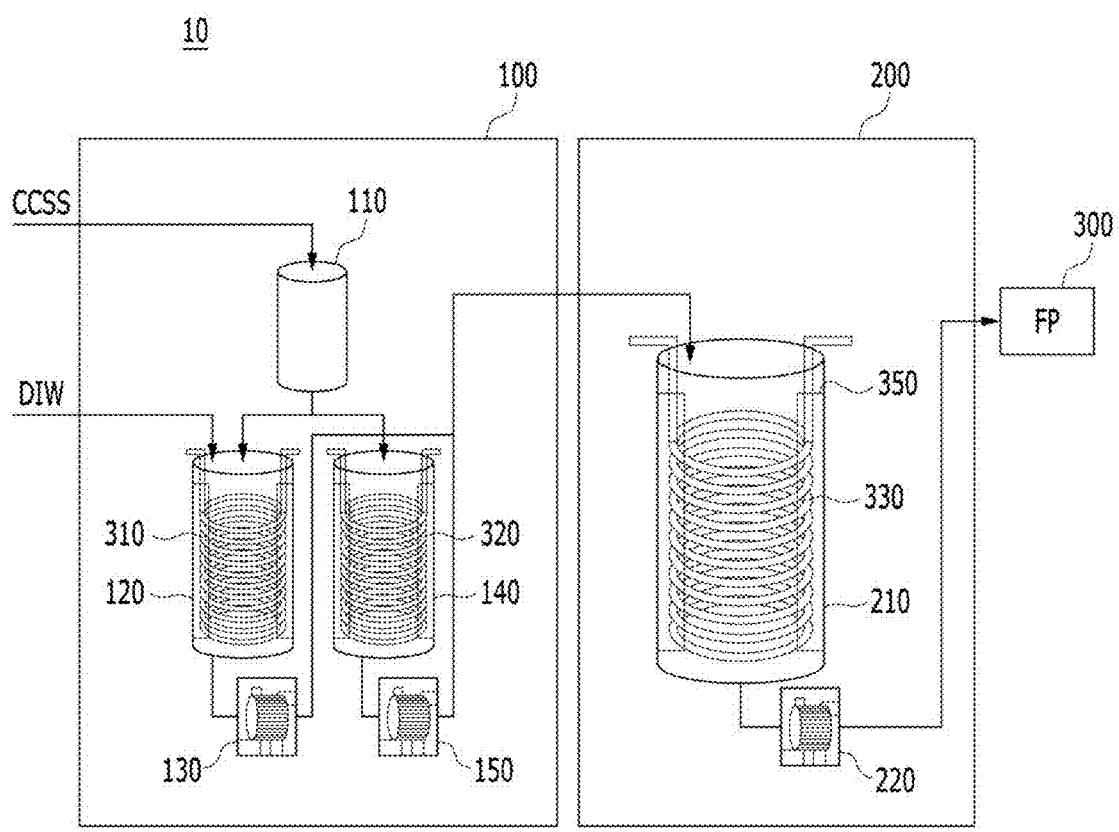
FIG. 1 is a configuration diagram of a slurry supply system of an embodiment.
Figure 2:
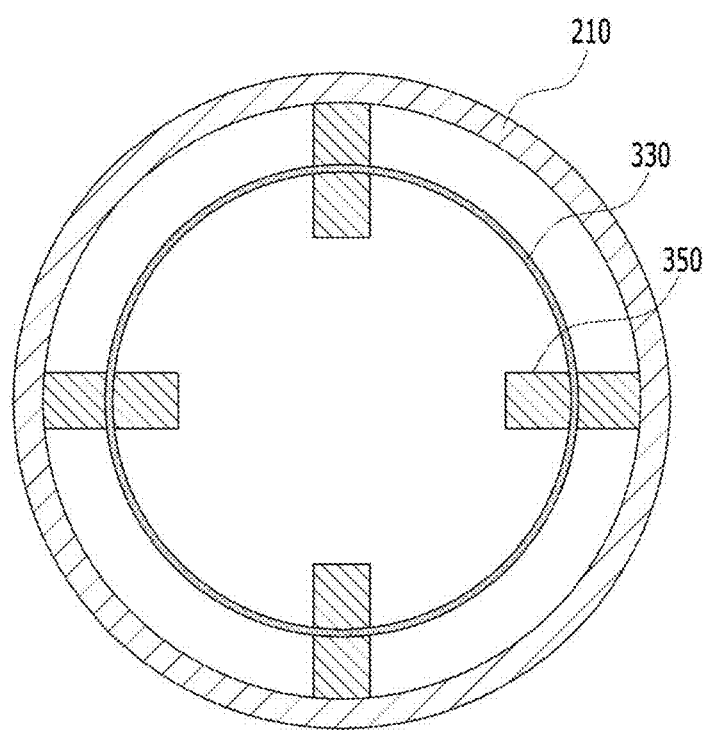
FIG. 2 is a cross-sectional view of an inside of a slurry tank of FIG. 1.

Hereinafter, embodiments will be shown more apparent through the description of the appended drawings and embodiments. In the description of the embodiment, when it is described that each layer (film), region, pattern, or structure is formed "above/on" or "below/under" a substrate, each layer (film), region, pad or pattern, the description includes being formed both "directly" or "indirectly (by interposing another layer)" "above/on" or "below/under". Also, a standard of above/on or below/under of each layer will be described based on the drawings.

Areas in the drawings may be exaggerated, omitted, or schematically described for a convenient and precise description. In addition, the size of each component does not fully match the actual size thereof. Further, like reference numbers represent like elements through description of the drawings. Hereinafter, an embodiment will be described with reference to the accompanying drawings.

Figure 3:
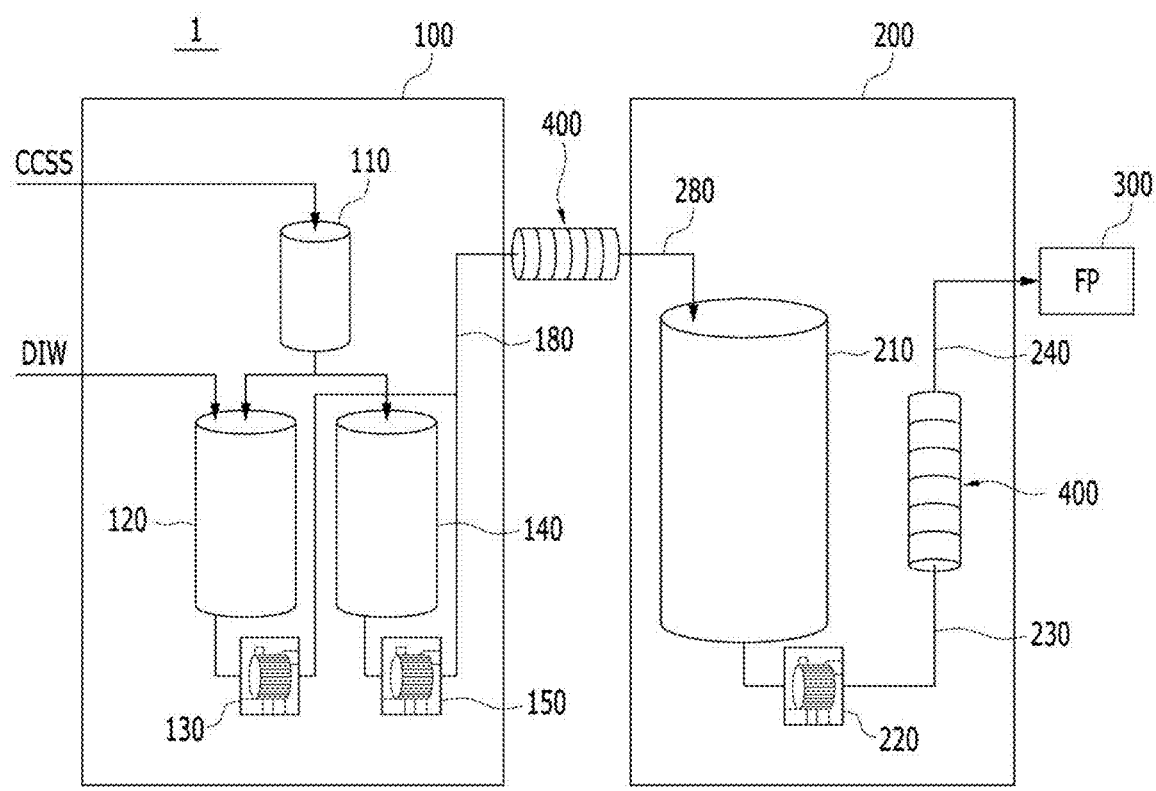
FIG. 3 is a configuration diagram of a slurry supply system according to an embodiment of the present invention.

FIG. 3 is a configuration diagram of a slurry supply system according to an embodiment of the present invention.

As shown in FIG. 3, a slurry supply system 1 according to an embodiment of the present invention may include a slurry mixing unit 100 and a slurry supply unit 200.

The slurry mixing unit 100 may mix polishing particles, dispersant, diluent, deionized water, and the like. For example, the slurry mixing unit 100 may include a distribution tank 110, a first mixing tank 120, a second mixing tank 140, a first pump 130, a second pump 150, and a transfer pipe 180. Here, since slurry maybe stored in the distribution tank 110, the first mixing tank 120, and the second mixing tank 140, they may be referred to as slurry tanks, slurry storage tanks, or storage tanks.

Pure slurry supplied from a central chemical supply system (CCSS) may be stored in the distribution tank 110. The distribution tank 110 may be supplied with an appropriate amount of slurry from the CCSS and may measure and send the appropriate amount of slurry to the first mixing tank 120.

The first mixing tank 120 may be distributed with the slurry stored in the distribution tank 110 and may mix the slurry and deionized water. The first mixing tank 120 may be installed with a pipe through which the deionized water is supplied and a pipe through which the slurry is supplied from the distribution tank 110.

The second mixing tank 140 may store the slurry mixed in the first mixing tank 120. That is, the slurry and the deionized water are mixed in the first mixing tank 120, and the slurry having been mixed at an appropriate ratio may be sent to the second mixing tank 140 and stored therein, and then transferred to the slurry supply unit 200.

The first pump 130 installed in the first mixing tank 120 may forcibly introduce the slurry having been mixed in the first mixing tank 120 into the second mixing tank 140, and the second pump 150 installed in the second mixing tank 140 may forcibly transfer the mixed slurry stored in the second mixing tank 140 to the slurry supply unit 200.

The transfer pipe 180 may transfer the mixed slurry stored in the second mixing tank 140 to the slurry supply unit 200, and may be installed to be connected to the second pump 150.

The slurry supply unit 200 may store the slurry mixed in the slurry mixing unit 100 and may supply the slurry to a polishing apparatus 300. To this end, the slurry supply unit 200 may include an inlet pipe 280, a storage tank 210, a third pump 220, a supply pipe 230, and a connection pipe 240.

The inlet pipe 280 may be configured to allow the mixed slurry to be introduced from the transfer pipe 180 of the slurry mixing unit 100 into the storage tank 210 to be stored therein.

A capacity of the storage tank 210 may be larger than those of the first mixing tank 120 and the second mixing tank 140, and the storage tank 210 may store a large volume of the mixed slurry before being sent to the polishing apparatus 300.

The third pump 220 may forcibly transfer the mixed slurry stored in the storage tank 210 to the supply pipe 230.

The supply pipe 230 may form a flow path through which the mixed slurry is transferred from the storage tank 210 toward the polishing apparatus 300 by the third pump 220. One side of the supply pipe 230 may be connected to the connection pipe 240 connected to the polishing apparatus 300.

The slurry supply system including the above-described configuration may further include a slurry cooling unit 400 which performs cooling of the mixed slurry flowing in at least one of the slurry mixing unit 100 and the slurry supply unit 200.

The slurry cooling unit 400 may be installed in at least one of pipes for connecting the slurry mixing unit 100 and the slurry supply unit 200 or a pipe for connecting the slurry supply unit 200 and the polishing apparatus 300. For example, as shown in FIG. 3, the slurry cooling unit 400 may be installed both between the transfer pipe 180 of the slurry mixing unit 100 and the inlet pipe 280 of the slurry supply unit 200 and between the supply pipe 230 of the slurry supply unit 200 and the connection pipe 240 of the polishing apparatus 300.

Since the slurry cooling unit 400 may be formed as a separate unit configured to cool down the slurry, it may be referred to as a slurry cooling apparatus. Hereinafter, configurations of the slurry cooling unit 400 or the slurry cooling apparatus 400 will be described in detail with reference to the drawings.

Figure 4:
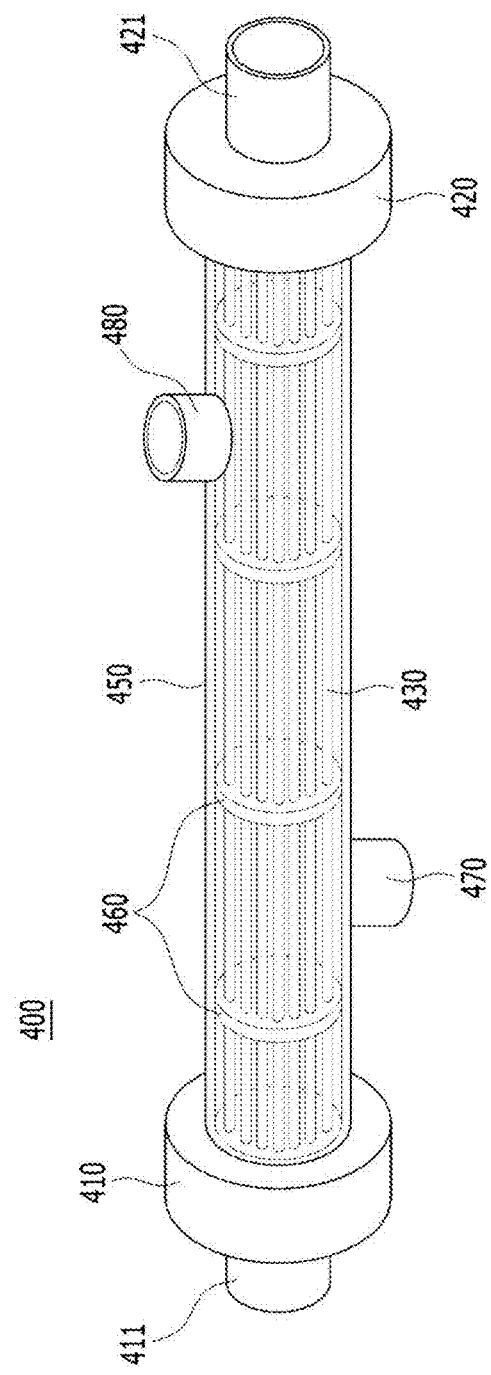
FIG. 4 is a perspective view of a slurry cooling apparatus of FIG. 3.
Figure 5:
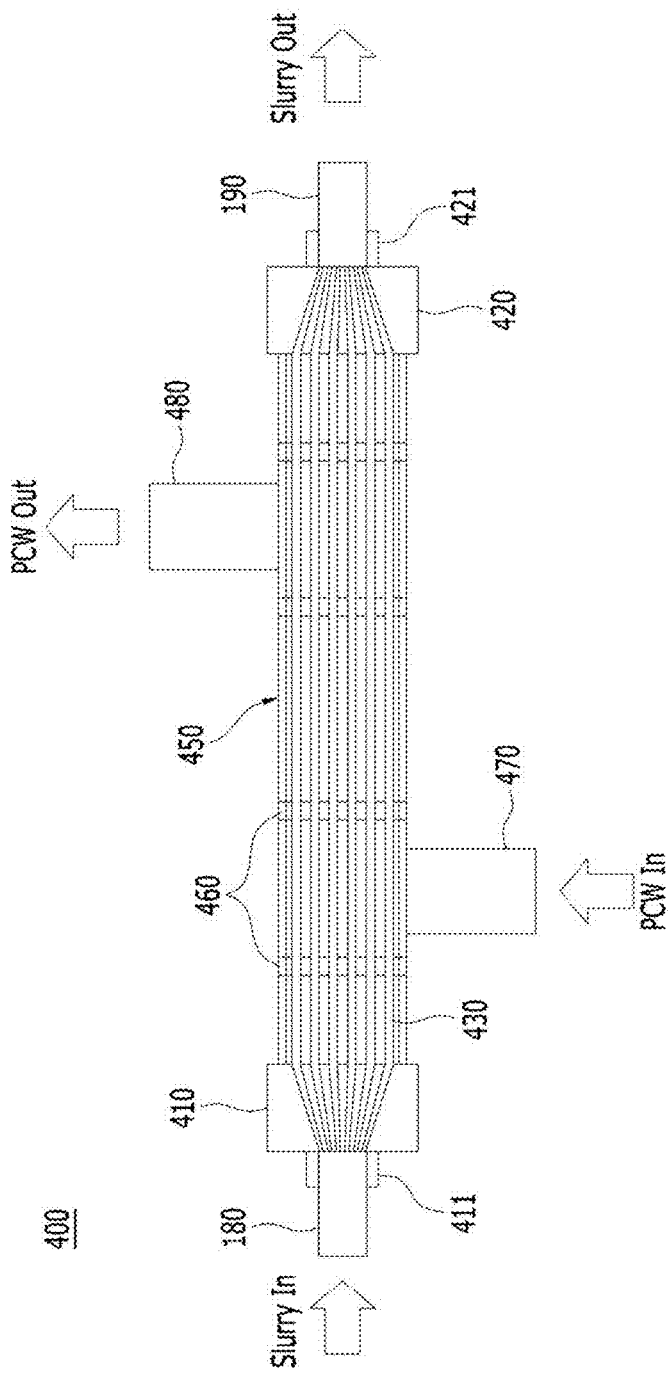
FIG. 5 is a vertical sectional view of FIG. 4 illustrating a flow of slurry and cooling water.
Figure 6:
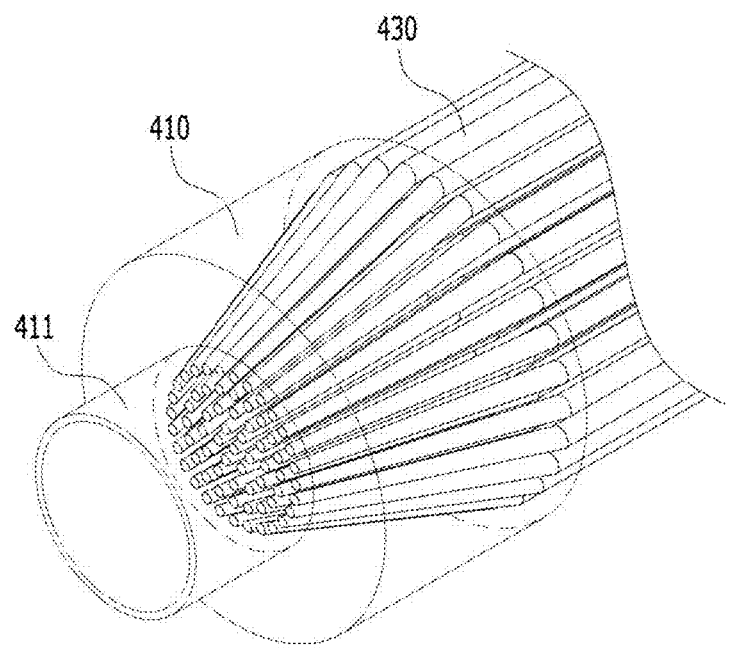
FIG. 6 is a perspective view of a coupling pipe and a first body region of FIG. 5.
Figure 7:
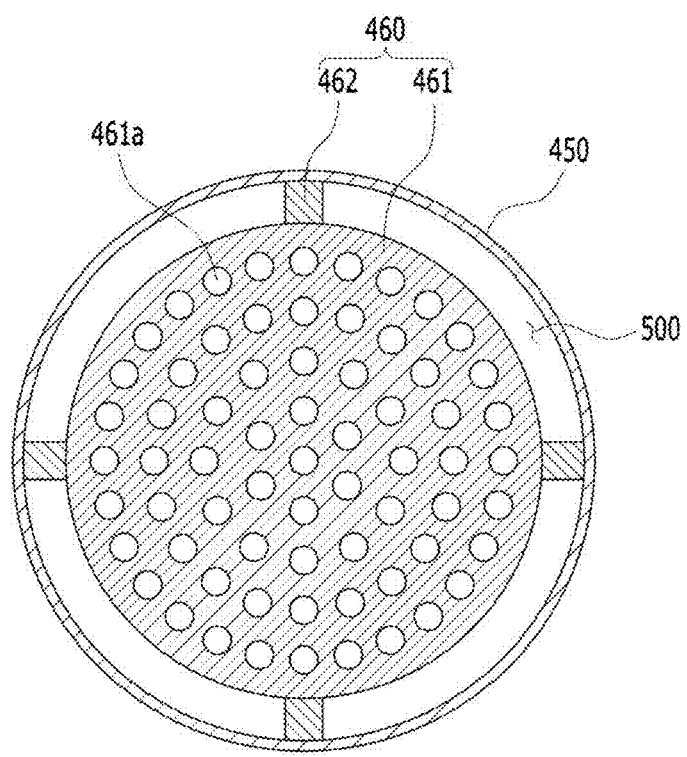
FIG. 7 is a view illustrating a state where a fixing plate of FIG. 3 is installed in a cooling water circulation pipe.

FIG. 4 is a perspective view of a slurry cooling apparatus of FIG. 3, FIG. 5 is a vertical sectional view of FIG. 4 illustrating a flow of slurry and cooling water, FIG. 6 is a perspective view of a coupling pipe and a first body region of FIG. 5, and FIG. 7 is a view illustrating a state where a fixing plate of FIG. 3 is installed in a cooling water circulation pipe.

As shown in FIGS. 4 to 7, the slurry cooling unit 400 may include a first body unit 410, a second body unit 420, a tube pipe 430, a cooling water circulation pipe 450, a fixing plate 460, a cooling water inlet pipe 470, and a cooling water outlet pipe 480.

The first body unit 410 may be connected to a pipe through which the mixed slurry is introduced. For example, the first body unit 410 may be connected to the transfer pipe 180 of the slurry mixing unit 100 or the supply pipe 230 of the slurry supply unit 200. The first body unit 410 may include a coupling pipe 411 pipe located so as to protrude outward so that a pipe is inserted and fixed thereto. That is, the coupling pipe 411 of the first body unit 410 may be connected to the transfer pipe 180 of the slurry mixing unit 100 or the supply pipe 230 of the slurry supply unit 200.

The second body unit 420 may be connected to a pipe through which the mixed slurry flows out. For example, the second body unit 420 may be connected to the inlet pipe 280 of the slurry supply unit 200 or the connection pipe 240 of the polishing apparatus 300. The second body unit 420 may include a coupling pipe 421 located so as to protrude outward so that a pipe is inserted and fixed thereto. That is, the coupling pipe 421 of the second body unit 420 may be connected to the inlet pipe 280 of the slurry supply unit 200 or the connection pipe 240 of the polishing apparatus 300.

The tube pipe 430 may be disposed in plural between the first body unit 410 and the second body unit 420, and thus the mixed slurry may be branched. For example, a plurality of tube pipes 430 may disperse an amount of the slurry introduced into the transfer pipe 180 and the supply pipe 230 having a large diameter so that the mixed slurry may be branched into the plurality of tube pipes 430 having a small diameter. The plurality of tube pipes 430 may increase cooling efficiency by widening a surface area of the mixed slurry flowing inside.

In addition, as shown in FIGS. 5 and 6, gaps between the plurality of tube pipes 430 may be gradually increased from an outer side to an inner side of the coupling pipes 411 and 421 so as to increase cooling efficiency so that the plurality of tube pipes 430 may be disposed spaced apart from the cooling water circulation pipe 450, which will be described later, at a predetermined interval.

The cooling water circulation pipe 450 may be coupled to the first body unit 410 and the second body unit 420 so as to surround outer sides of the plurality of tube pipes 430 and configured to allow the cooling water to circulate therein. For example, the cooling water circulation pipe 450 may be formed of a pipe having a circular cross-section and having a size similar to the diameters of the first body unit 410 and the second body unit 420.

The fixing plate 460 may be inserted into the cooling water circulation pipe 450 to fix the spacing locations of the plurality of tube pipes 430. The fixing plate 460 may be disposed in plural spaced apart from an inner side of the cooling water circulation pipe 450 so that the plurality of tube pipes 430 may be stably located inside the cooling water circulation pipe 450.

For example, as shown in FIG. 7, the fixing plate 460 may include a fixing plate body 461 and a coupling protrusion 462.

The fixing plate body 461 has a circular cross section and a plurality of insertion holes 461a through which the plurality of tube pipes 430 are inserted may be formed therein. The plurality of insertion holes 461a may be disposed spaced apart from each other at a predetermined interval, and the plurality of tube pipes 430 inserted into the plurality of insertion holes 461a may be cooled down with a predetermined contact area by the cooling water while maintaining a predetermined interval.

The coupling protrusion 462 may be formed in plural, be coupled to an outer side of the fixing plate body 461, and be in close contact with the inner side of the cooling water circulation pipe 450. The fixing plate body 461 may be fixed to the cooling water circulation pipe 450 while being in close contact therewith by the coupling protrusions 462. A plurality of coupling protrusions 462 may be disposed spaced apart from each other at a predetermined interval to form a flow path 500 configured to circulate the cooling water inside the cooling water circulation pipe 450. For example, four coupling protrusions 462 may be disposed spaced apart from each other at a predetermined interval in upper, lower, left, and right portions of the fixing plate body 461, but the number, shape and the like may be varied.

As shown in FIGS. 4 and 5, the plurality of tube pipes 430 may be stably located inside the cooling water circulation pipe 450 without sagging down even though the plurality of tube pipes 430 are disposed long by the fixing plate 460 including the above-described configuration.

The cooling water inlet pipe 470 may be coupled to the cooling water circulation pipe 450, and may introduce the cooling water into the cooling water circulation pipe 450. The cooling water outlet pipe 480 may be coupled to the cooling water circulation pipe 450 and may discharge the cooling water circulated in the cooling water circulation pipe 450. Here, the cooling water inlet pipe 470 may be disposed adjacent to the first body unit 410 into which the mixed slurry is introduced, and the cooling water outlet pipe 480 may be disposed adjacent to the second body unit 420 through which the mixed slurry flows out.

Accordingly, the cooling water configured to flow in the cooling water circulation pipe 450 may cool down the mixed slurry, and the cooling water whose temperature has increased may be discharged to outside. In addition, since cold cooling water is introduced into the cooling water inlet pipe 470 again, the cooling water circulation pipe 450 may keep the cooling temperature of the mixed slurry constant by cooling down the plurality of tube pipes 430 at a predetermined temperature.

Further, the cooling water inlet pipe 470 may be located in a lower portion of the cooling water circulation pipe 450, and the cooling water outlet pipe 480 may be located in an upper portion of the cooling water circulation pipe 450, which may be attached to the same or opposite locations with respect to each other.

As described above, according to a slurry cooling apparatus and a slurry supply system having the same of the present invention, it is possible to prevent slurry from being contaminated by leakage of cooling water while efficiently cooling down the slurry through a slurry cooling unit mounted on an outside of pipes through which the slurry flows.

The above-described slurry cooling unit 400 may be made of a transparent material. For example, at least one of the first body unit 410, the second body unit 420, the tube pipe 430, the cooling water circulation pipe 450, the fixing plate 460, the cooling water inlet pipe 470, and the cooling water outlet pipe 480 may be a transparent material.

In addition, as shown above, since the slurry cooling unit is made of a transparent material, breakage and leakage state of the slurry cooling unit or the pipe through which the slurry flows may be checked with naked eyes, and thus it can be easily recognized that a tube pipe or a cooling water circulation pipe is broken.

The features, structures, effects and the like described in the embodiments are included in at least one embodiment of the present invention and are not necessarily limited to only one embodiment. Furthermore, the features, structures, effects and the like illustrated in the embodiments may be combined or modified with other embodiments by those skilled in the art to which the embodiments belong. Accordingly, it is to be understood that such combination and modification are included in the scope of the present invention.

DESCRIPTION OF REFERENCE NUMERALS

| | |
|---|---|
| 1, 10: slurry supply system | 100: slurry mixing unit |
| 110: distribution tank | 120: first mixing tank |
| 130: first pump | 140: second mixing tank |
| 150: second pump | 180: transfer pipe |
| 200: slurry supply unit | 210: storage tank |
| 220: third pump | 230: supply pipe |
| 240: connection pipe | 280: inlet pipe |
| 300: polishing apparatus (FP) | 400: slurry cooling unit (cooling apparatus) |
| 410: first body unit | 420: second body unit |
| 411, 421: coupling pipe | 430: tube pipe |
| 450: cooling water circulation pipe | 460: fixing plate |
| 461: fixing plate body | 461a: insertion hole |
| 462: coupling protrusion | 470: cooling water inlet pipe |
| 480: cooling water outlet pipe | 500: cooling water flow path |

What is claimed is:

1. A slurry supply system comprising:
   a slurry mixing unit configured to mix slurry;
   a slurry supply unit in which the slurry mixed in the slurry mixing unit is stored and configured to supply die slurry to a polishing apparatus;
   a pipe configured to connect the slurry mixing unit and the slurry supply unit; and
   a slurry cooling unit installed in at least one of pipes configured to connect the slurry supply unit and the polishing apparatus to cool down the mixed slurry,
   wherein the slurry mixing unit comprises:
      a distribution rank in which slurry supplied from a central chemical supply system (CCSS) is stored;
      a first mixing tank configured to mix the slurry and dionized water after the slurry stored in the distribution tank is distributed;
      a second mixing tank in which the slurry mixed in the first mixing tank is stored; and
      a transfer pipe configured to transfer the mixed slurry stored in the second mixing tank to the slurry supply unit,
   wherein the slurry supply comprises:
      a supply pipe configured to supply slurry to the polishing apparatus;
      an inlet pipe through which the mixed slurry is introduced from the transfer pipe; and
      a storage tank connected to the inlet pipe to store the mixed slurry and connected to the supply pipe,
   wherein the slurry cooling unit comprises:
      a first body unit connected to a pipe through which the mixed slurry is introduced;
      a second body unit connected to a pipe through which the mixed slurry flows out;
      a plurality of tube pipes disposed between the first body unit and the second body unit and configured to branch the mixed slurry; and
      a cooling water circulation pipe coupled to the first and second body units to surround outer sides of the plurality of tube pipes and configured to circulate cooling water there,
   wherein the first body unit and the second body unit each comprise a coupling pipe located so as to protrude outward so that a pipe is inserted and fixed thereto, and wherein gaps between the plurality of tube pipes are gradually increased from an outer side to an inner side of the coupling pipe so that the plurality of tube pipes may be disposed spaced apart from the cooling water circulation pipe at a predetermined interval.

2. The slurry supply system of claim 1, wherein the slurry cooling unit is installed at both between the transfer pipe and the inlet pipe, and between the supply pipe and a connection pipe configured to connect the polishing apparatus.

3. The slurry supply system of claim 1, further comprising a fixing plate inserted into the cooling water circulation pipe and configured to fix a spacing position of the plurality of tube pipes.

4. The slurry supply system of claim 3, wherein the fixing plate is disposed in plural spaced apart from an inner side of the cooling water circulation pipe.

5. The slurry supply system of claim 4,
wherein the fixing plate comprises:
a fixing plate body having a plurality of insertion holes into which the plurality of tube pipes are inserted formed therein; and
a plurality of coupling protrusions coupled to an outer side of the fixing plate body and in close contact with the inner side of the cooling water circulation pipe.

6. The slurry supply system of claim 5, wherein the plurality of coupling protrusions are disposed spaced apart from each other at a predetermined interval to form a flow path configured to circulate the cooling water inside the cooling water circulation pipe.

7. The slurry supply system of claim 5,
wherein the slurry cooling unit further comprises:
a cooling water inlet pipe coupled to the cooling water circulation pipe and configured to introduce cooling water into the cooling water circulation pipe; and
a cooling water outlet pipe coupled to the cooling water circulation pipe and configured to discharge the cooling water circulated in the cooling water circulation pipe.

8. The slurry supply system of claim 7, wherein the cooling water inlet pipe is disposed adjacent to the first body unit, and the cooling water outlet pipe is disposed adjacent to the second body unit.

9. The slurry supply system of claim 8, wherein the cooling water inlet pipe is located in a lower portion of the cooling water circulation pipe, and the cooling water outlet pipe is located in an upper portion of the cooling water circulation pipe.

10. The slurry supply system of claim 1, wherein the slurry cooling unit is made of a transparent material.

* * * * *